United States Patent [19]

Cho et al.

[11] Patent Number: 5,757,252
[45] Date of Patent: May 26, 1998

[54] WIDE FREQUENCY BAND TRANSITION BETWEEN VIA RF TRANSMISSION LINES AND PLANAR TRANSMISSION LINES

[75] Inventors: Ching-Fai Cho, Tujunga; Helmut Carl Maiershofer, Valencia; Do Bum Shin, Santa Clarita; Avery Yee Quil, Simi Valley, all of Calif.

[73] Assignee: ITT Industries, Inc., White Plains, N.Y.

[21] Appl. No.: 661,557

[22] Filed: Jun. 11, 1996

Related U.S. Application Data

[60] Provisional application No. 60/003,292, Sep. 6, 1995, and provisional application No. 60/032,026, Aug. 31, 1995.

[51] Int. Cl.⁶ .................. H01P 3/08; H01P 5/00; H05K 1/11
[52] U.S. Cl. .................. 333/246; 333/260; 333/34; 361/792; 174/262
[58] Field of Search .................. 333/245, 246, 333/260, 34; 174/262–266; 361/784, 792

[56] References Cited

U.S. PATENT DOCUMENTS

| | | | |
|---|---|---|---|
| 4,494,083 | 1/1985 | Josefsson et al. | 333/246 X |
| 4,626,805 | 12/1986 | Jones | 333/260 X |
| 5,157,477 | 10/1992 | Chance | 361/792 X |
| 5,304,743 | 4/1994 | Sen et al. | 174/262 |
| 5,401,912 | 3/1995 | Mattei | 174/262 X |
| 5,408,053 | 4/1995 | Young | 174/262 X |

OTHER PUBLICATIONS

J.A. Ferrante, G.E. Melvin, E.N. Urfer, "High Conductivity Lines in Multilayer Ceramic Substrates"; *IBM Technical Disclosure Bulletin*, vol. 21 No. 5; Oct. 1978; pp. 1860, 1861.

*Primary Examiner*—Robert Pascal
*Assistant Examiner*—Barbara Summons
*Attorney, Agent, or Firm*—Plevy & Associates

[57] ABSTRACT

A multi-layer circuit structure including a plurality of substrate layers. At least one planar transmission line, including microstrip, stripline, or coplanar line, disposed on the plurality of substrate layers. A via transmission line connected to that at least one planar transmission line and extending through the plurality of substrate layers. The via transmission lines having the same topology as the at least one planar transmission line for providing wide frequency band transition between the via transmission lines and the at least one planar transmission line.

8 Claims, 17 Drawing Sheets

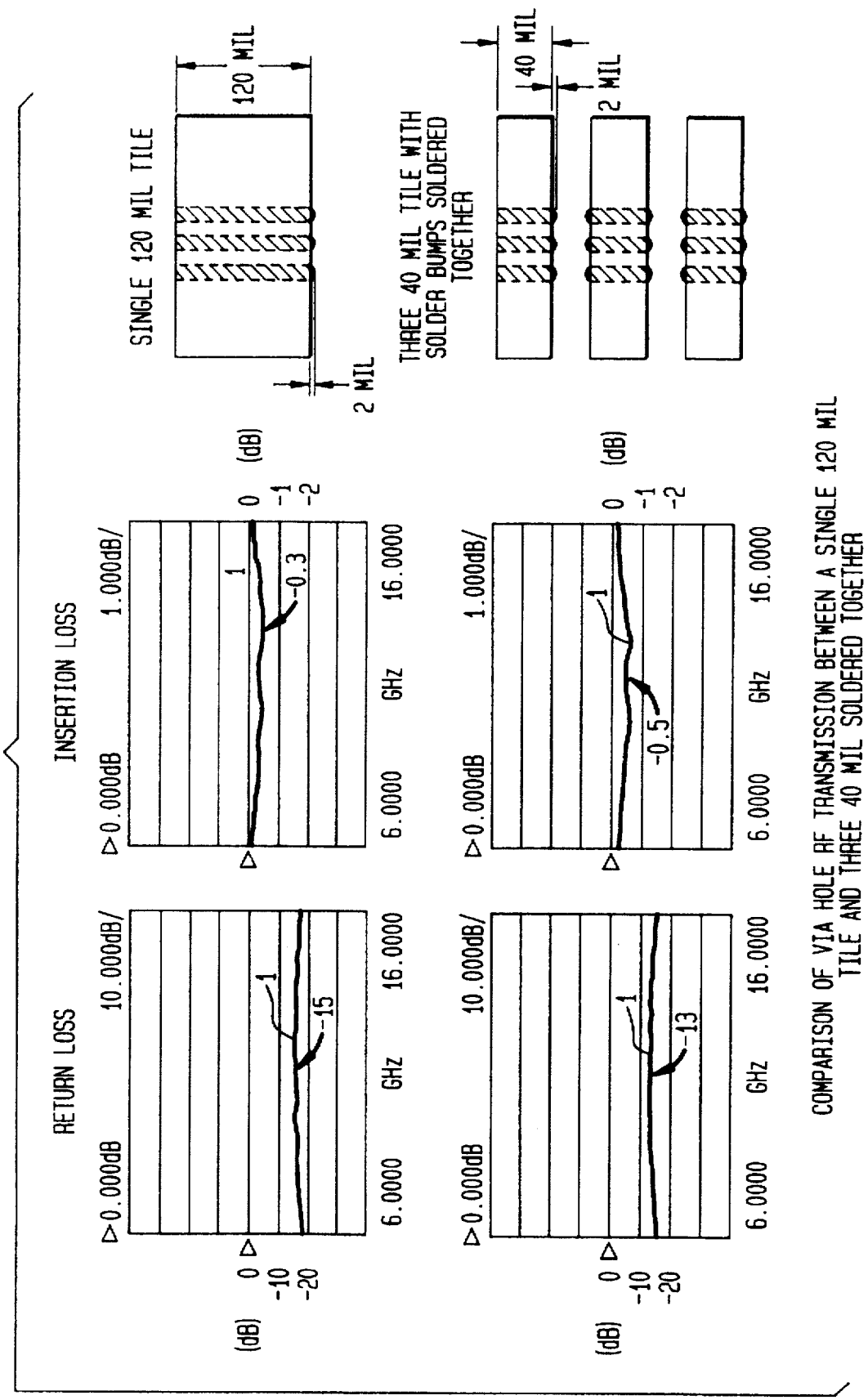

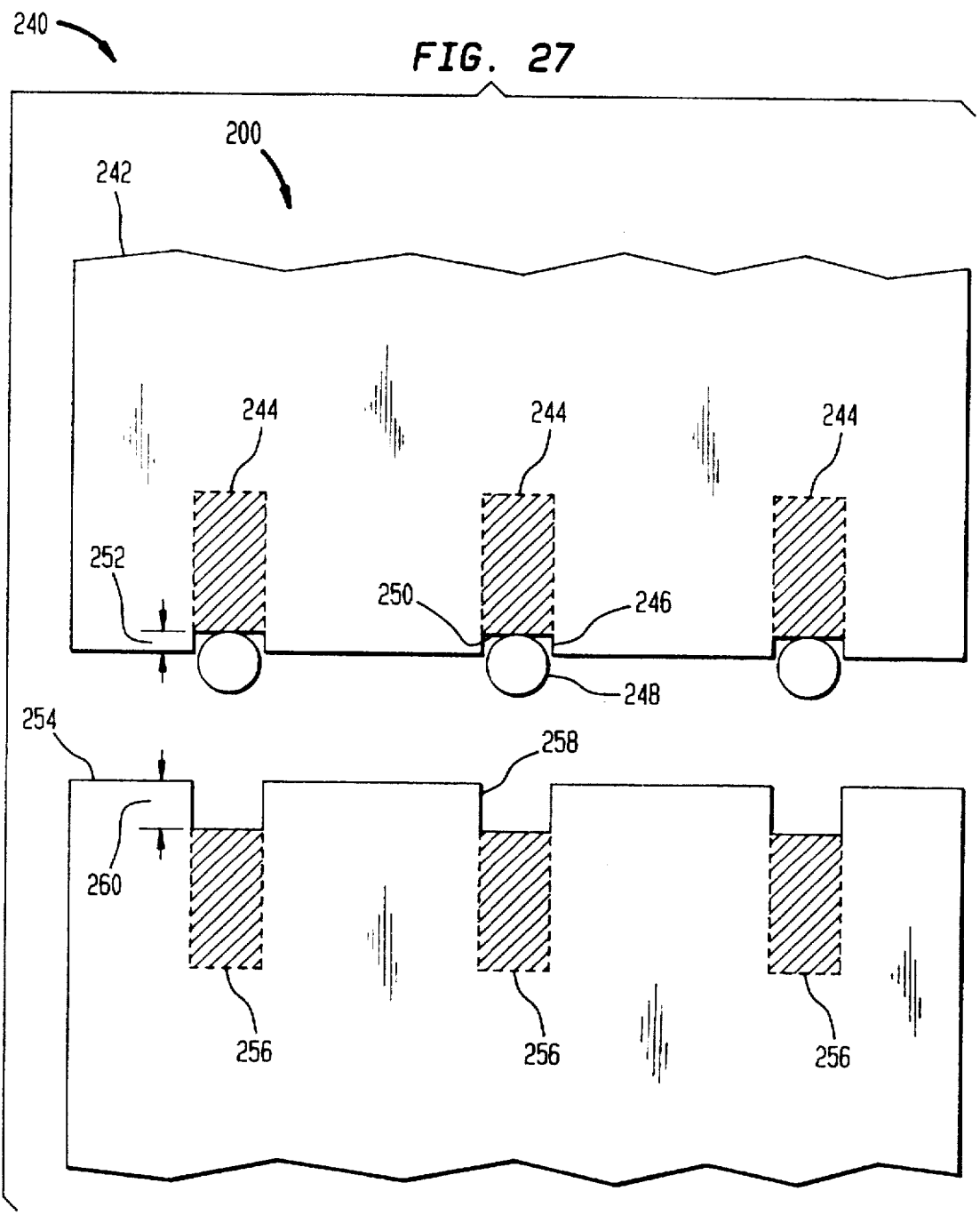

5,757,252

WIDE FREQUENCY BAND TRANSITION BETWEEN VIA RF TRANSMISSION LINES AND PLANAR TRANSMISSION LINES

AFFECTIVE FILING DATE OF APPLICATION

This application includes the subject matter of provisional patent application Ser. No. 60/003,292 to Cho, entitled WIDE FREQUENCY BAND TRANSITION BETWEEN VIA-HOLE RF TRANSMISSION LINES AND PLANAR TRANSMISSION LINES, filed Sep. 6, 1995 and provisional patent application number 60/032,026 to Cho et al., entitled VIA-HOLES AS RF TRANSMISSION LINES IN MULTI-LAYER CIRCUITS, filed Aug. 31, 1995.

BACKGROUND OF THE INVENTION

1. Field of the Invention

The present invention relates generally to electrical circuit interconnection and more particularly, to a multilayer circuit structure for Radio Frequency circuits, which includes via transmission lines and planar transmission lines having the same topology enabling wide frequency band interconnection between the layers of the structure and the interconnection of two or more structures.

2. Description of the Prior Art

In RF circuit development, there often exists a need to increase the density of a circuit per volume rather than per area. For example, in airborne phase scanning antennas employing transmit/receive (T/R) modules and radiating elements, it may be necessary to pack a complicated set of circuit elements between the radiating elements and the T/R modules into a small volume of space.

A block diagram of such an airborne phased array antenna element 10 having polarization agility is shown in FIG. 1, including a plurality of elemental radiators 24, 26 and a satellite communication transmit (T) channel 12, a satellite communication receive (R) channel 14, and a radar T/R channel 16. The channels 12, 14, 16 are embodied as GaAs chips. The polarization of the T channel 12 and the R channel 14 are orthogonal to each other and operate at different frequency bands. Further, the T/R channel 16 operates at yet another frequency band, and always with vertical polarization.

Implementing the antenna element 10 of FIG. 1 requires a complicated set of circuit elements. Consequently, due to space constraints, the circuit elements comprising the antenna element 10 must often be vertically stacked on top of one another in different horizontal planes. As a result, RF signals processed by these circuit elements must be vertically fed between the stacked circuit elements that lie in different horizontal planes.

FIG. 2 shows an example of a multi-layer configuration 30 for the circuit elements shown in FIG. 1. As shown, a plurality of vertical feed throughs 32, 33 connect between various layers of the multilayer configuration 30 between the radiators 24, 26 and the chips 12, 14, 16. However, such vertical feedthroughs 32, 33 are generally limited to interconnecting only adjacent horizontal circuit layers. The feed through distance in such cases is usually quite short relative to a wavelength, and the transition can be treated as a junction mismatch problem, especially for narrow frequency band.

However, the vertical feed lines 35 interconnecting the circuit elements on non-adjacent circuit layers are relatively long, having lengths of up to a wavelength. In such cases, stand-alone transmission lines such as conventional coaxial lines must be used, which have fixed impedances and are capable of carrying a signal a pre-determined distance. However, stand-alone transmission lines take up valuable space and are impractical for high frequency operations. Furthermore, they are labor intensive and extremely costly for high volume production.

Attempts have been made at utilizing via as RF grounding lines and as DC lines in printed circuits. However, most of the attempts have been for RF transmission lines that traverse no more than a small fraction of a wavelength, and no attempt has been made for vias as parallel wire RF transmission lines that traverse more than a wavelength.

Further attempts have been made at interconnecting such circuit layers by utilizing vias as RF transmission lines. However, due to the difficulties in properly matching the transition between the via RF transmission lines and the planar transmission lines, such attempts have not been fully successful for wide frequency band transmission.

There is often radiation loss at the transition between via RF transmission lines and planar transmission lines. There has been no simple, cost effective method of suppressing such radiations.

Accordingly, it is an object of the present invention to provide an improved technique of transmitting RF signals using via transmission lines through distances up to at least 0.5" at DC to Ku band with low insertion loss (insertion loss at Ku band is better than 0.5 dB).

Accordingly, it is a further object of the present invention to provide an improved method for interconnecting the circuit patterns of multilayer circuit configuration which utilized vias as RF transmission lines.

Accordingly, it is a further object of the present invention to provide an improved technique for matching the transition between via RF transmission lines and planar transmission lines to accommodate wide frequency band transmission.

Accordingly, it is a further object of the present invention to provide an improved technique of using vias as mode suppressors at the transition from via RF transmission lines and planar transmission lines to suppress radiations.

Low Temperature Co-fired Ceramics (LTCC) is a technology used as a method for producing general multilayer circuit structure, which includes providing a plurality of substrate layers. It is also the object of the present invention to use this method of substrate fabrication to embody via RF transmission line structures for RF transmission and transition. The structures are constructed by punching a plurality of via holes in a predetermined configuration within each of the plurality of substrate layers; filling the plurality of via holes of each plurality of substrate layers with a conductive material; disposing a pattern of conductive material on the plurality of substrate layers, which forms a plurality of processed layers; stacking the plurality of processed layers, which forms a multi-layer configuration including a plurality of via transmission lines; and firing the multilayer configuration which produces the multilayer circuit structure. Furthermore, via RF transmission lines from two or more multilayer circuit structures can be electrically interconnected by disposing a pattern of conductive material on the vias, aligning the vias and fixing via connection. The interconnection can also be accomplished with, but not limited to solder bumps, epoxies, interposers or mechanical contacts.

SUMMARY OF THE INVENTION

A multilayer circuit structure including a plurality of substrate layers. At least one planar transmission line disposed on the plurality of substrate layers. A via transmission line connected to each of the at least one planar transmission line and extending through the plurality of substrate layers. The via transmission lines having the same topology as the at least one planar transmission line for providing wide frequency band transition between the via transmission lines and the at least one planar transmission line. The matching of the transition from via transmission line to planar transmission line can be further improved by requiring the symmetry between the ground wires and the signal lines be preserved at the transition region. Furthermore, to suppress radiation at the junction, vias can be used as mode suppressors.

BRIEF DESCRIPTION OF THE DRAWING

The above objects, further features and advantages of the present invention are described in detail below in conjunction with the drawings, of which:

FIG. 26 is comparison between return loss and insertion loss of three-wire via transmission line in a single LTCC multilayer assembly and that in three LTCC multilayer assemblies with vias soldered together with solder bumps;

FIG. 27 is a schematic view of interconnecting via RF transmission lines between two multi-layer circuit assemblies with recesses in the vias at the junction.

DETAILED DESCRIPTION OF THE DRAWING

The present invention provides a technique for interconnecting circuit elements of different layers of a multilayer circuit configuration by utilizing vias as RF transmission lines.

The processed via transmission lines described herein are designed to operate as conventional RF multi-wire transmission lines. As such, each multi-wire line must comprise at lease one signal line. However, any number of ground lines can be employed.

Figure 1:
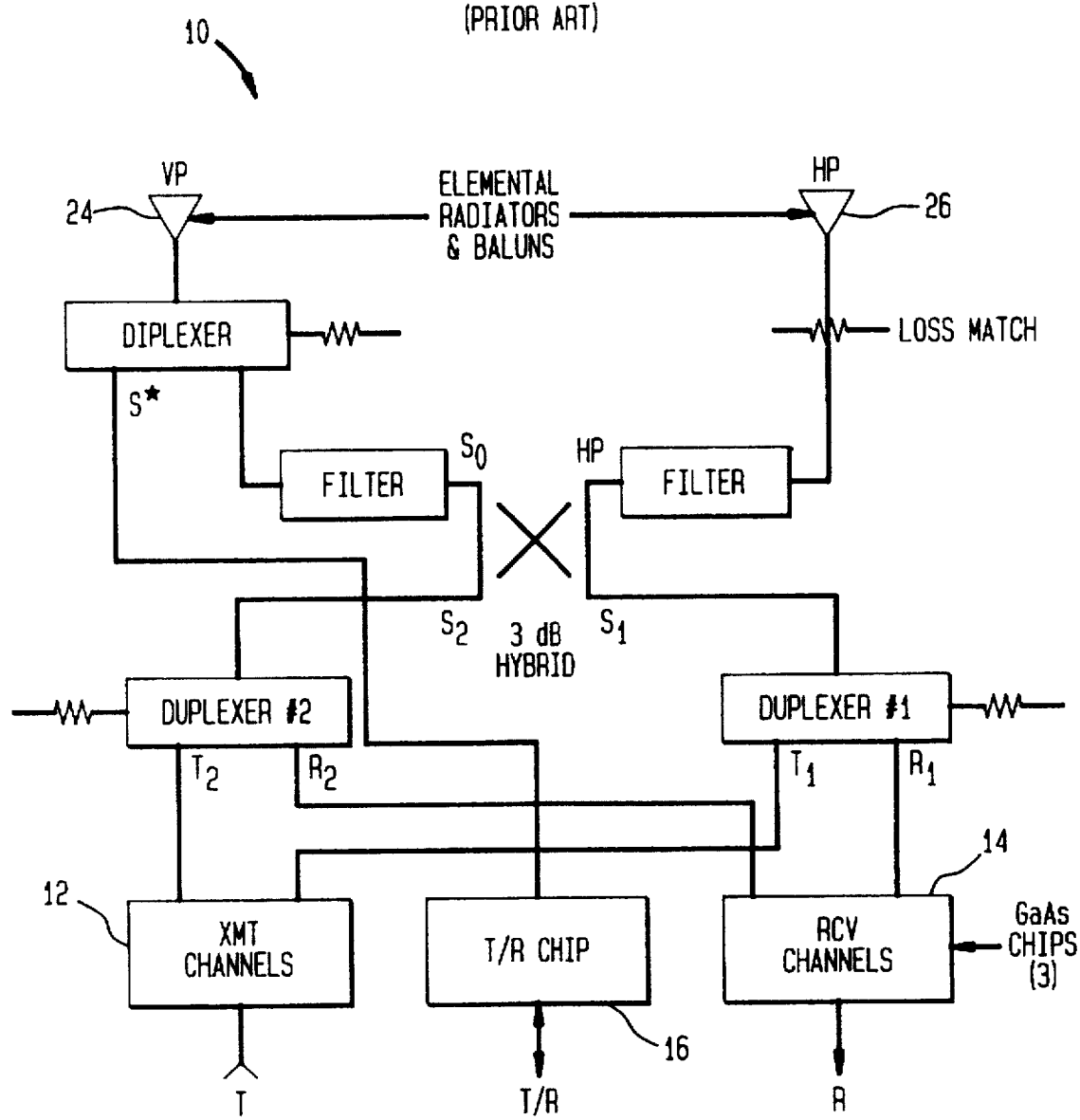
FIG. 1 As a block diagram of a prior art airborne phased scanning antenna element.
Figure 2:
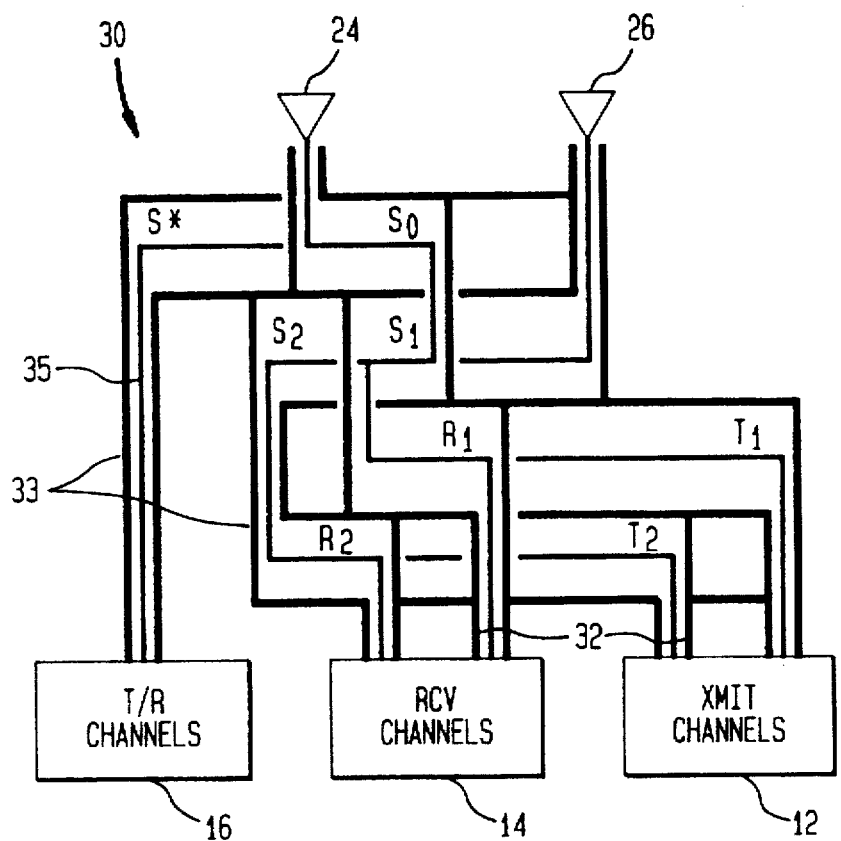
FIG. 2 is a schematic view of a multilayer circuit configuration for the airborne phase scanning antenna element shown in FIG. 1.
Figure 3:
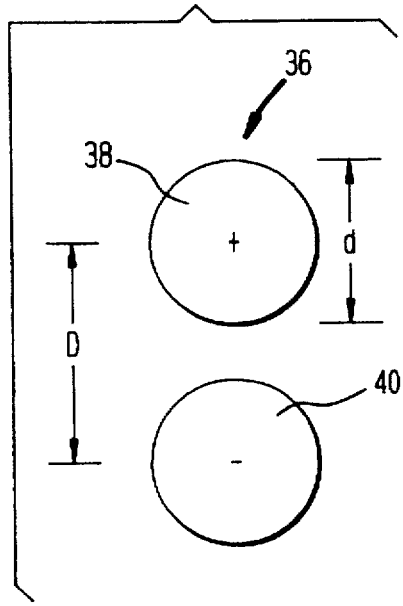
FIG. 3 is an illustrative view of a two-wire via transmission line according to the present invention.

For example, a schematic view of a two-wire via line 36 is shown in FIG. 3, comprising one signal line 38 and one ground line 40. The approximate characteristic impedance of this two-wire via line 36 is given as a function of the dielectric constant $\epsilon$, the via pitch D, and the via diameter d, or $z=(120/\sqrt{\epsilon})*\cosh^{-1}*(D/d)$. Thus, for 50$\Omega$ transmission line in a substrate with a dielectric constant of 5.9, the ratio D/d is approximately 1.56.

There are several advantages associated with such two-wire via lines. For example, two-wire via lines are more compact as compared to other multi-wire lines. In addition, two-wire via lines have the advantage of having the same topology as a microstrip line (one signal and one ground). As such, transitions from microstrip to two-wire via lines can be readily achieved, as will be described later.

On the other hand, there are several disadvantages associated with such two-wire via lines. For example, the signal in a two-wire via line is inadequately shielded and isolated from the adjacent two-wire via line. In addition, the small D/d ratio of the two-wire via line (1.56) creates manufacturing difficulties for LTCC transmission lines.

Figure 4:
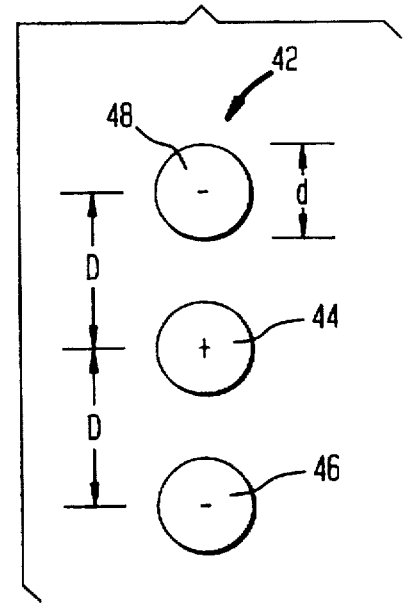
FIG. 4 is an illustrative view of a three-wire via transmission line according to the present invention.

The present invention is not limited to the two-wire via line 36 shown in FIG. 3. Referring to FIG. 4, a schematic view of a three-wire via line 42 is shown comprising one signal line 44 positioned between two ground lines 46, 48. However, unlike the two-wire via line 36, the three-wire via line 42 cannot be expressed in closed form because the three finite diameter cylinders cannot be approximated by quasi-line sources. As such, any commercially available electromagnetic simulation software program can be used to calculate the characteristic impedance of the three-wire via line. Such programs are well known in the art. Accordingly, for 50 Ω transmission line in a substrate with a dielectric constant of 5.9, the ratio D/d calculates to approximately 2.35.

Figure 6:
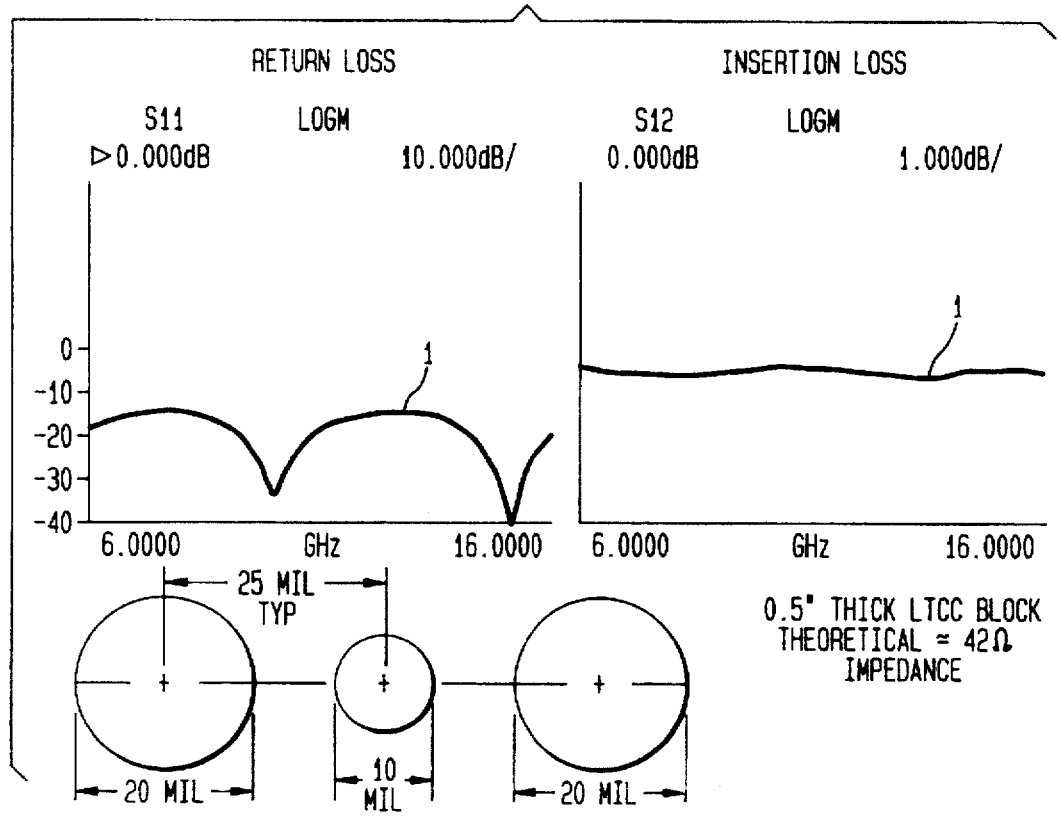
FIG. 6 gives measured return loss and insertion loss of a three-wire via transmission line through 0.5" of LTCC with dielectric constant of 5.9.

FIG. 6 shows the measured return loss and insertion loss of a three wire via line through 0.5" of LTCC with dielectric constant of 5.9. The insertion loss is seen to be better than 0.5 dB from 6 to 16 GHz.

This 3-wire via line configuration 42 see FIG. 4 has the advantage of having the same topology as a stripline or a coplanar line (one signal and two grounds). In addition, transitions from stripline or a coplanar line to three-wire via lines can be readily achieved, as will be described later. Further, such three-wire via lines 42 provide moderate shielding, as compared to other multi-wire lines. Finally, such three-wire via line 42 are reasonably compact.

Figure 5:
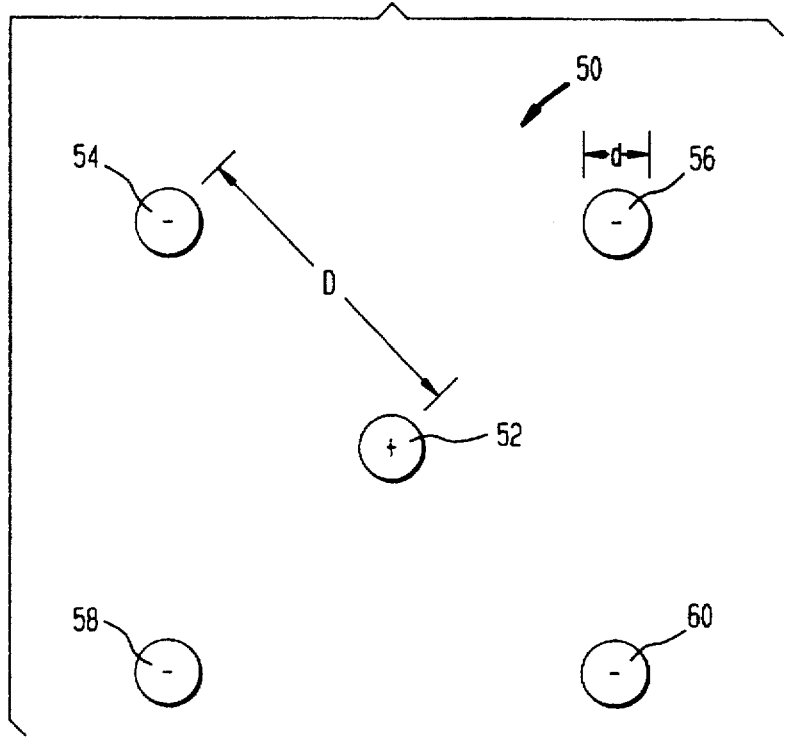
FIG. 5 is an illustrative view of a five-wire via transmission line according to the present invention.

In addition to the two-wire via line 36 see FIG. 3 and three-wire via line 42 described above, a five-wire via line can also be employed. Referring to FIG. 5, a five-wire via line 50 is shown having a signal lead 52 centrally positioned between 4 ground lines 54, 56,58, 60. Similar to the two-wire via line 36, the approximate characteristic impedance of the five-wire via line 50 is given as a function of the dielectric constant $\epsilon$, the via pitch D, and the via-hole diameter d, or $Z=(75.2/\sqrt{\epsilon})*\ln(1.52*D/d)$ for $D/d>>1$). Thus, for 50 Ω transmission line in a substrate with a dielectric constant of 5.9, the ratio D/d equals 3.3. However, unlike the two-wire via line, the five-wire via line takes up more space, due to the 3 extra ground wires.

It should be understood that the present invention is not limited to the multi-wire configurations described herein, and other via multi-line configurations fall within the scope of this invention. For example, if more shielding is required, additional ground wires can be used to surround the signal line.

Figure 7:
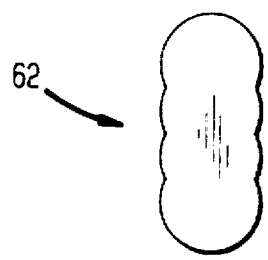
FIG. 7 is an illustrative view of an elongated via functioning as a quasi-ground plane according to the present invention.
Figure 8:
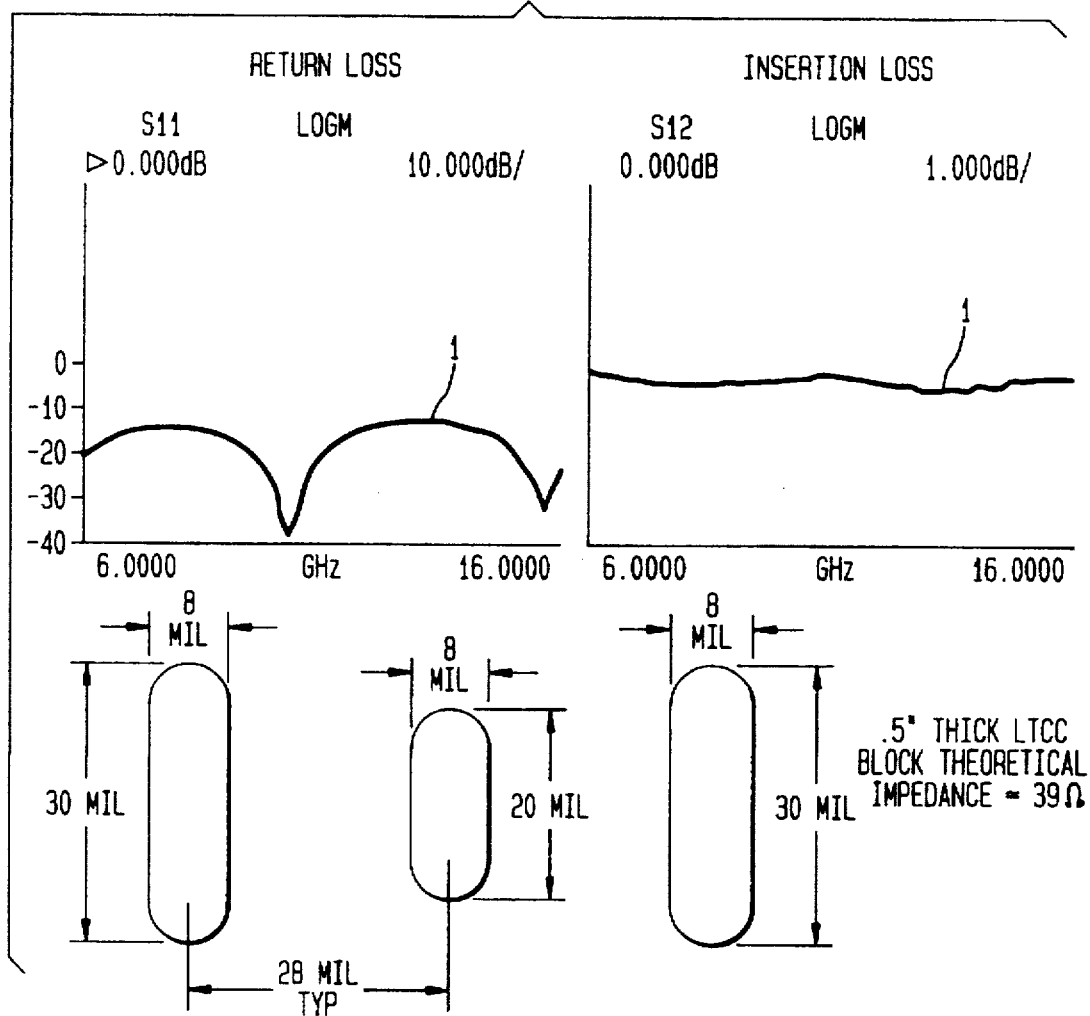
FIG. 8 gives measured return loss and insertion loss of a via quasi-stripline (two elongated vias as ground and a circular hole as signal line) through 0.5" of LTCC with dielectric constant of 5.9.
Figure 9:
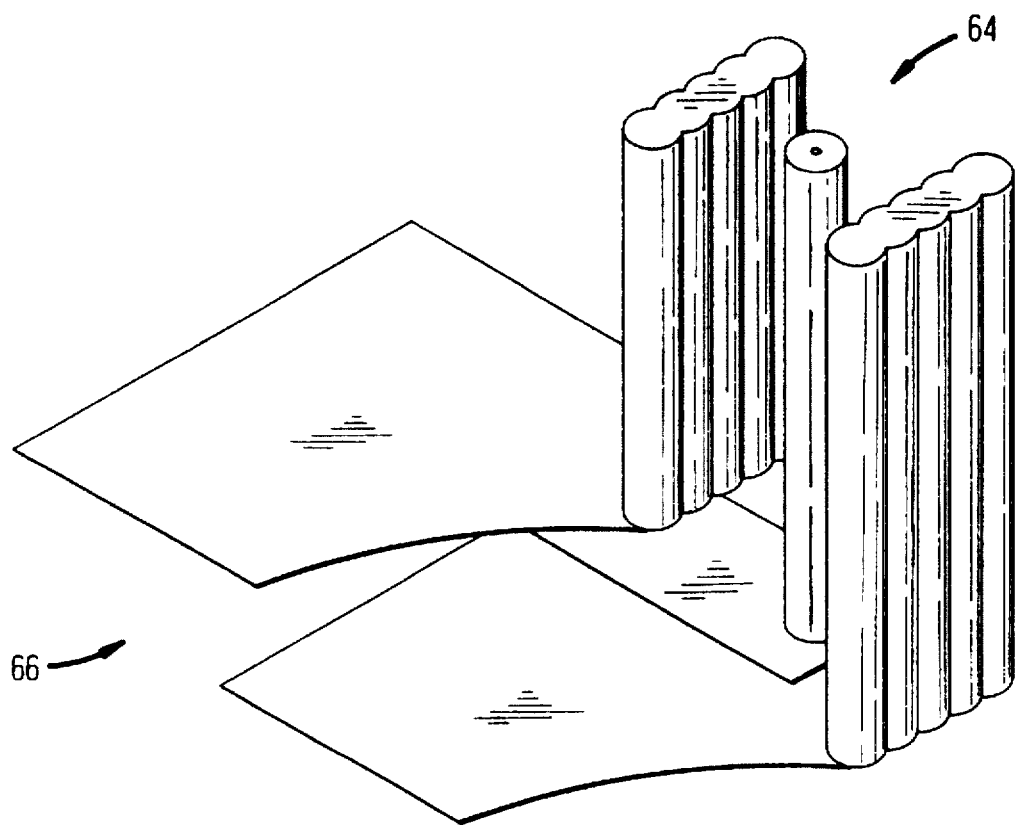
FIG. 9 is a perspective view illustrating a transition from a via quasi-stripline to a planar stripline according to the present invention.
Figure 10:
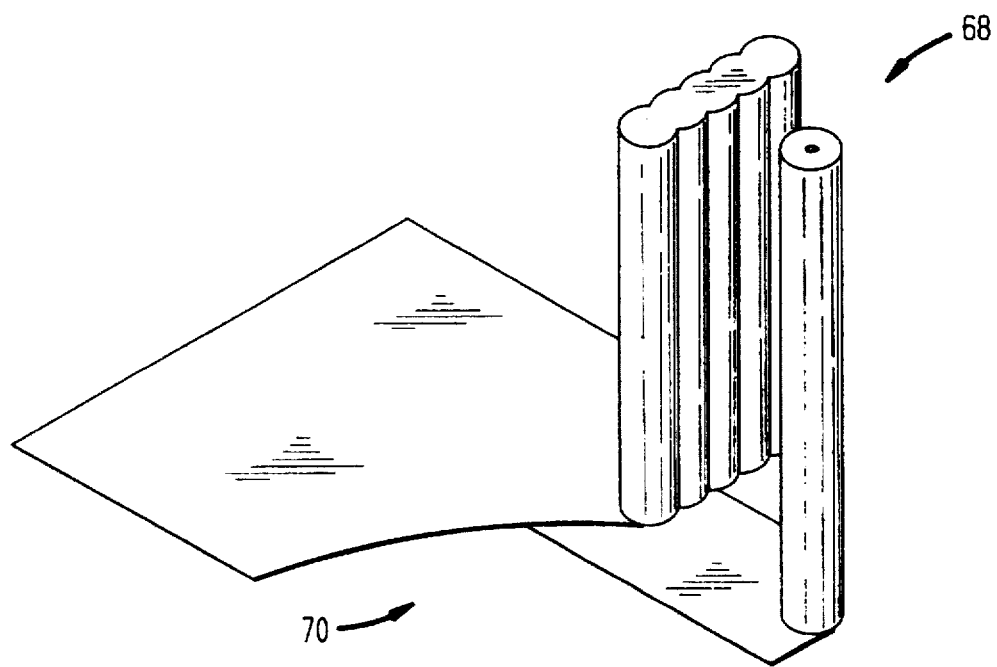
FIG. 10 is perspective view illustrating a transition from a via quasi microstrip line to a planar microstrip line according to the present invention.

Additionally, the via can overlap to form an elongated via 62 (shown in FIG. 7), which serves as a quasi-ground plane for via quasi stripline or via microstrip line. The return loss and insertion loss of a quasi stripline through 0.5" of LTCC with dielectric constant equal to 5.9 is given in FIG. 8. The insertion loss is seen to be less than 0.5 dB from 6 to 16 GHz. The transition from a via quasi-stripline 64 to a planar stripline 66 is shown in FIG. 9. Further, the transition from a via quasi-microstrip line 68 to a planar microstrip line 70 is shown in FIG. 10.

The present invention further provides a technique for matching the transition between via RF transmission lines and planar transmission lines to accommodate wide frequency band transmission.

In an embodiment of the present invention, wide frequency band transitions between via RF transmission lines and planar transmission lines are obtained by selecting the same topology between the planar transmission line and the via transmission line, and by preserving as much as possible the symmetry between ground wires and the signal wires at the transition. Furthermore, to suppress radiating at the junction, vias are sometimes used as mode suppressors.

Figure 11:
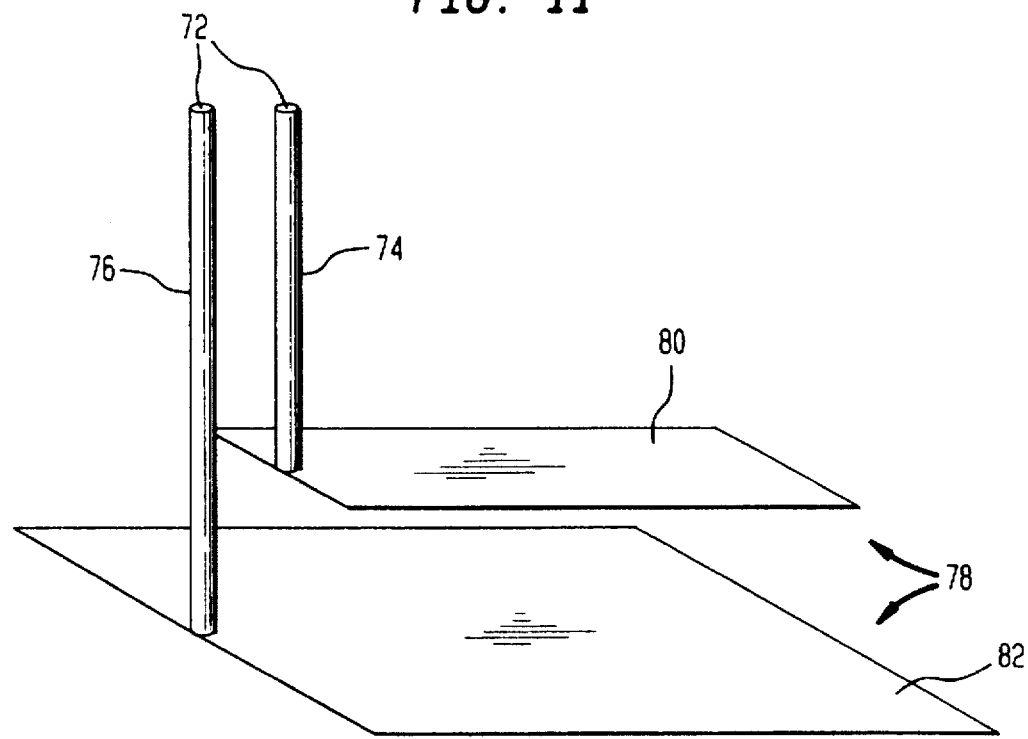
FIG. 11 is a perspective view illustrating a transition from a two-wire via transmission line to a microstrip line according to the present invention.

For example, as shown in FIG. 11, a two-wire via transmission line 72 has the same topology as a microstrip line 78. Particularly, a via transmission line 72 comprises one signal wire 74 and one ground wire 76, and a microstrip line 78 comprises one signal wire 80 and one ground wire 82. Since both lines have the same topology, wide frequency band transition between the two-wire via transmission line 72 and the microstrip line 78 is accomplished.

Figure 12:
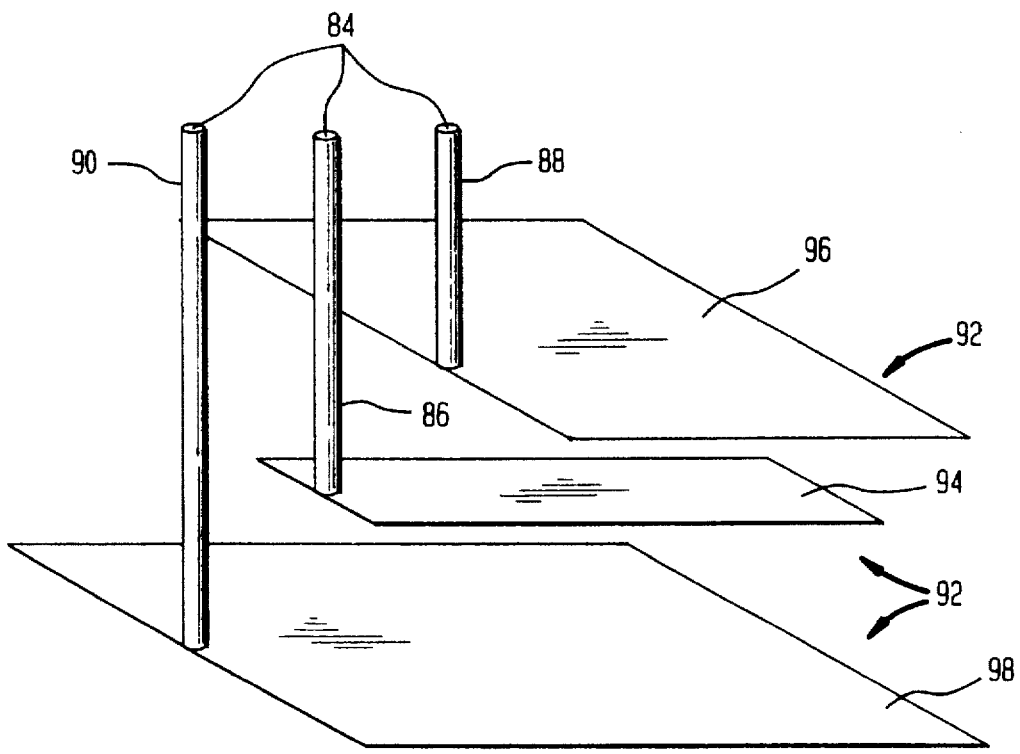
FIG. 12 is a perspective view illustrating a transition from a three-wire via transmission line to a stripline according to the present invention.

Likewise, as shown in FIG. 12, a three-wire via transmission line 84 also is configured to have the same topology as the stripline 92. Particularly, a via transmission line 84 comprises one signal wire 86 X and two ground wires 88, 90 and a stripline 92 comprises one signal wire 94 and two ground wires 96, 98. Accordingly, wide frequency band transition between the three-wire via-transmission line 84 and the stripline 92 can be accomplished.

Figure 13:
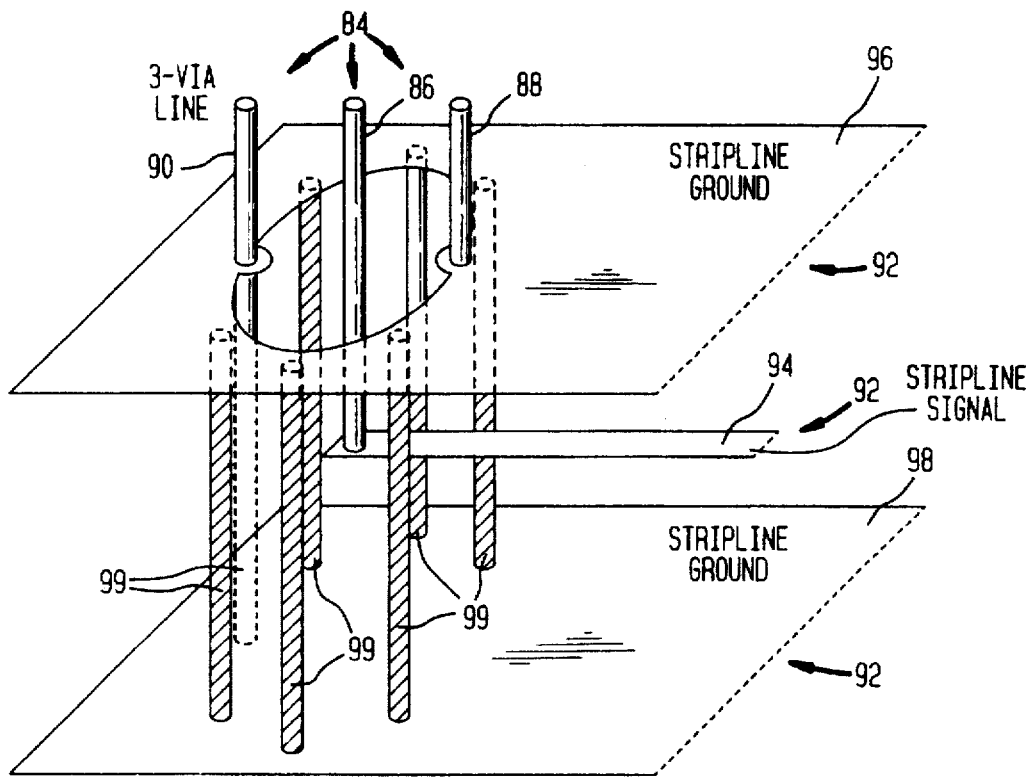
FIG. 13 is a perspective view illustrating a transition from a three-wire via transmission line to a stripline with a ring of vias as radiation suppressors according to the present invention.
Figure 14:
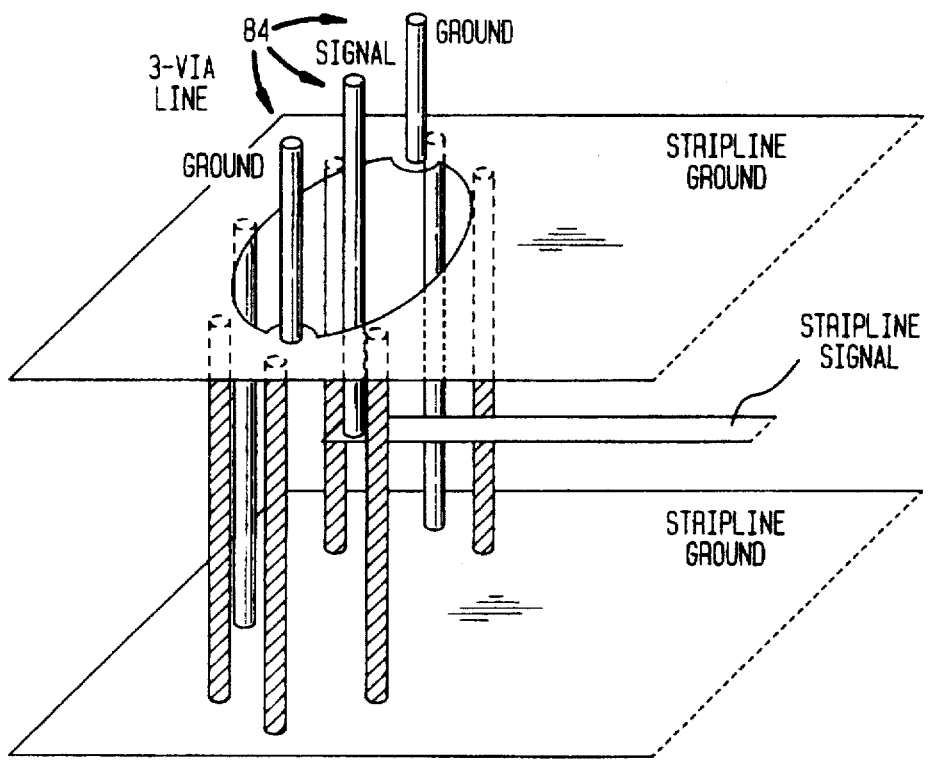
FIG. 14 is a perspective view illustrating a transition from a three-wire via transmission line to a stripline with a ring of vias and with the orientation of the input three-wire vias rotated 90 degrees.

However, in this kind of right angle transitions, radiation at the junction often occurs, resulting in radiative loss. This can often be remedied by mode suppressors as shown in FIG. 13, where the three-wire via transmission line 84 is surrounded by a ring of vias 99 at the transition to the stripline 92. With conventional technology, adding this ring of vias would have been a labor intensive effort. However, with the LTCC technology, the ring of vias can be added in the same production assembly line with minimal extra effort. Furthermore, with this ring of vias, the transition may be considered as a transition from a three-wire via transmission line to a quasi-coax line, and the orientation of the input three-wire via line 84 can be rotated as shown in FIG. 14 to provide more flexibility in circuit arrangements.

Figure 15A:
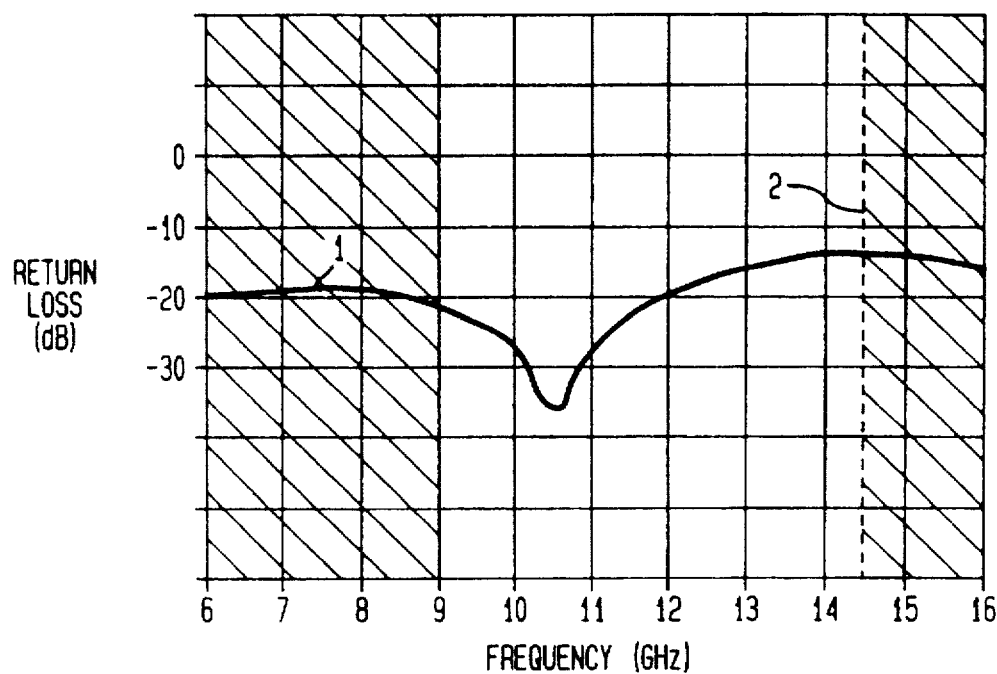
FIG. 15 gives measured return loss and insertion loss of transition from three-wire via transmission line to a stripline and then back to a three-wire via transmission line.
Figure 15B:
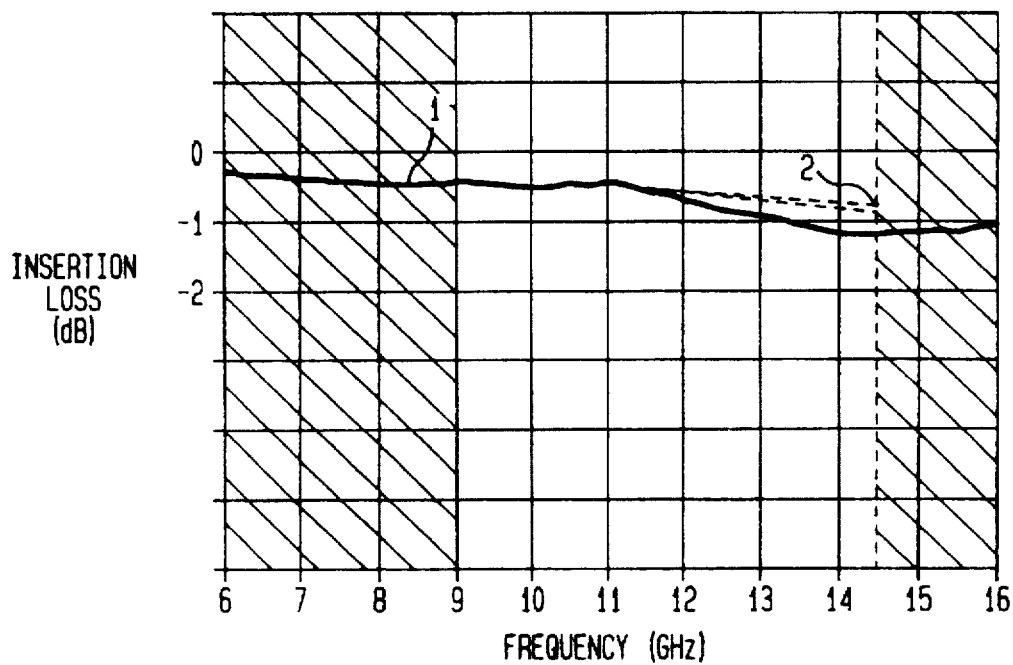

FIG. 15 shows the return loss and insertion loss of such a three-wire via to stripline transition from 6 to 16 GHz. The result, while not optimized, is very good.

Figure 16:
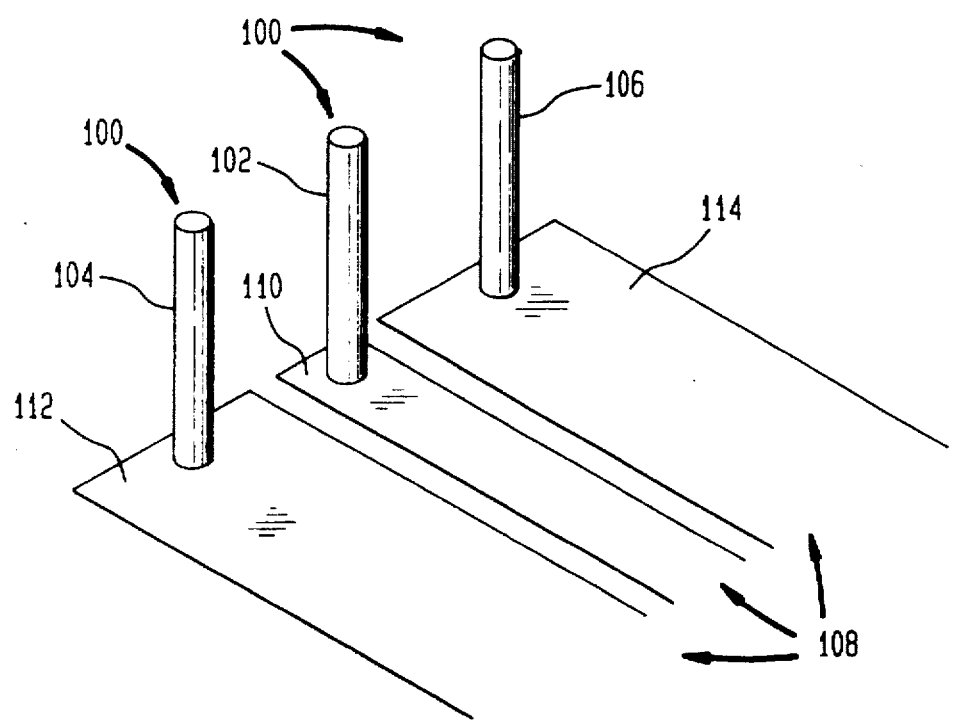
FIG. 16 is a perspective view illustrating a transition from a three-wire via transmission line to a coplanar line according to the present invention.
Figure 17A:
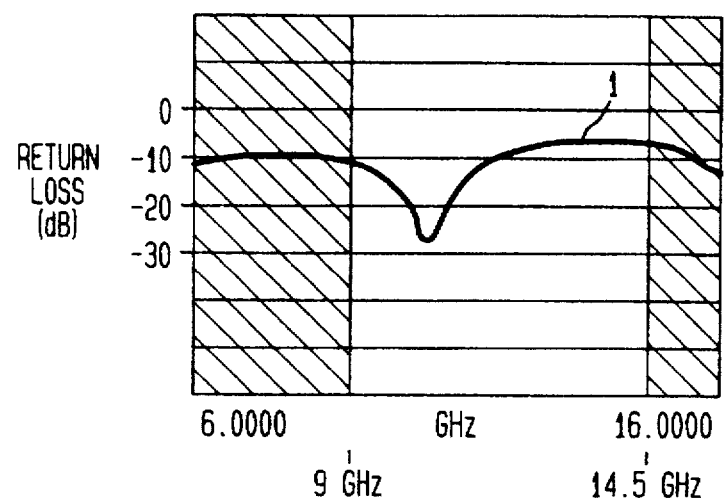
FIG. 17 gives measured return loss and insertion loss of transition from a three-wire via transmission line to a stripline and then back to a three-wire via transmission line.
Figure 17B:
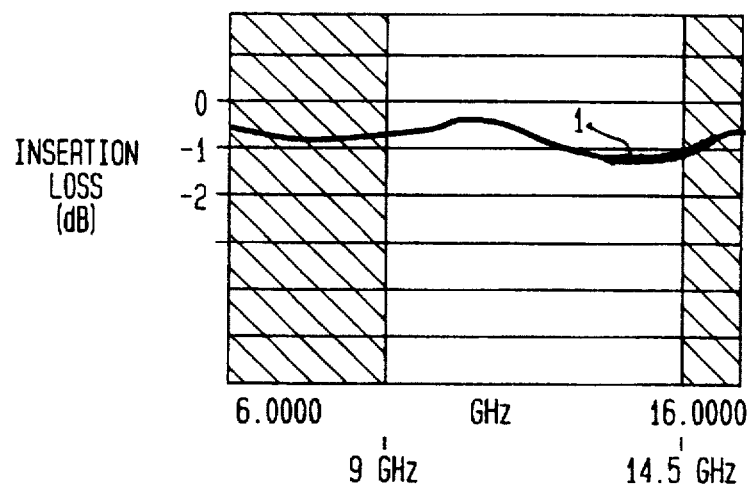

In addition, as shown in FIG. 16, a three-wire via transmission line 100 is similar in topology to a coplanar line 108. Particularly, a via transmission line 100 comprises one signal wire 102 and two ground wires 104, 106, and a coplanar line 108 comprises one signal wire 110 and two ground wires 112, 114. Thus, wide frequency band transition between the three-wire via transmission line 100 and the coplanar line 108 is accomplished. FIG. 17 shows the transition from three-wire via transmission line to a coplanar line from 6 to 16 Ghz. The moderate return loss is due to the fact that the coplanar line is not exactly 50 Ω. Taking that into account, the transition is quite good.

Figure 18:
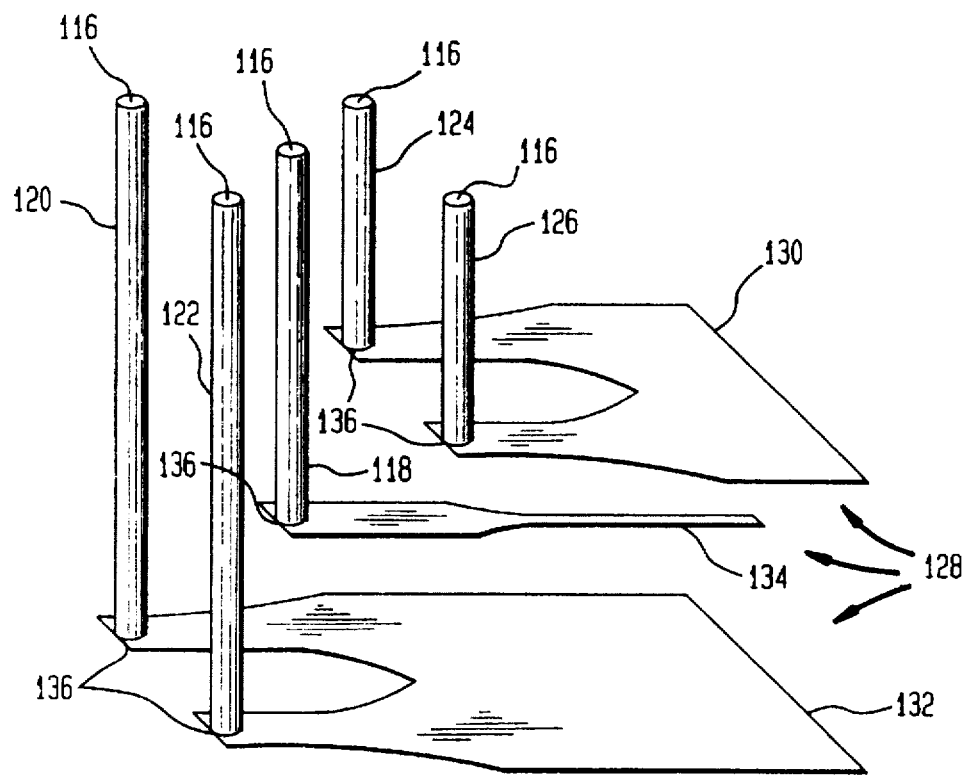
FIG. 18 is a perspective view illustrating a transition from a five-wire via transmission line to a five-line planar stripline according to the present invention.

Finally, wide frequency band transition can be obtained between a five-wire via transmission line and a stripline. As shown in FIG. 18, a five-wire via transmission line 116 is shown comprising one signal wire 118 surrounded by four ground wires 120, 122, 124, 126. Although the topology of the five-wire via transmission line 116 is not the same as conventional planar transmission lines, similar topology can be obtained by converting a stripline 128 having two grounds 130, 132 and one signal line 134 into planer five-strip line 136. As a result, wide frequency band transition is obtained.

In another embodiment of the present invention, further increase in frequency band transition is obtained by tapering the ground lines and the signal lines of the planar transmission line into strips of equal widths and equal impedance, while maintaining the same overall impedance in the line.

Figure 19:
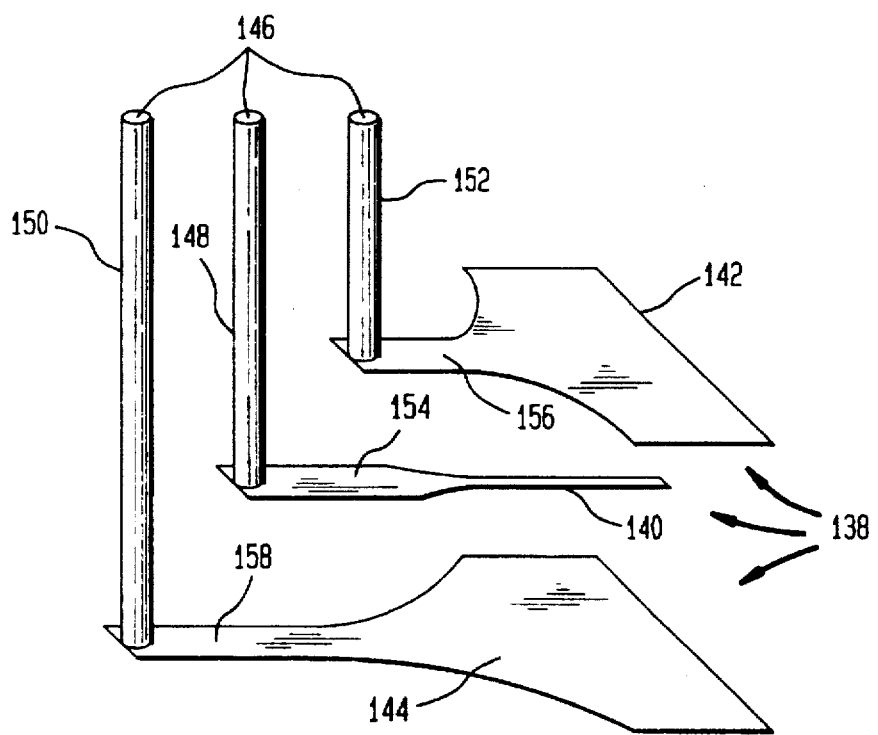
FIG. 19 is a perspective view illustrating a transition from a three-wire via transmission line to a tapered stripline according to the present invention.

Referring to FIG. 19, a stripline 138 is tapered to match three-wire via transmission line 146. Assuming that the diameters of the wires 148, 150, 152 forming the via transmission line 146 are equal, wide frequency band transition is obtained by tapering the two ground planes 142, 144 and the signal line 140 of the stripline 138 onto three strips 154, 156, 158 having equal widths and equal impedances, while maintaining the same overall impedance in the line.

Figure 20:
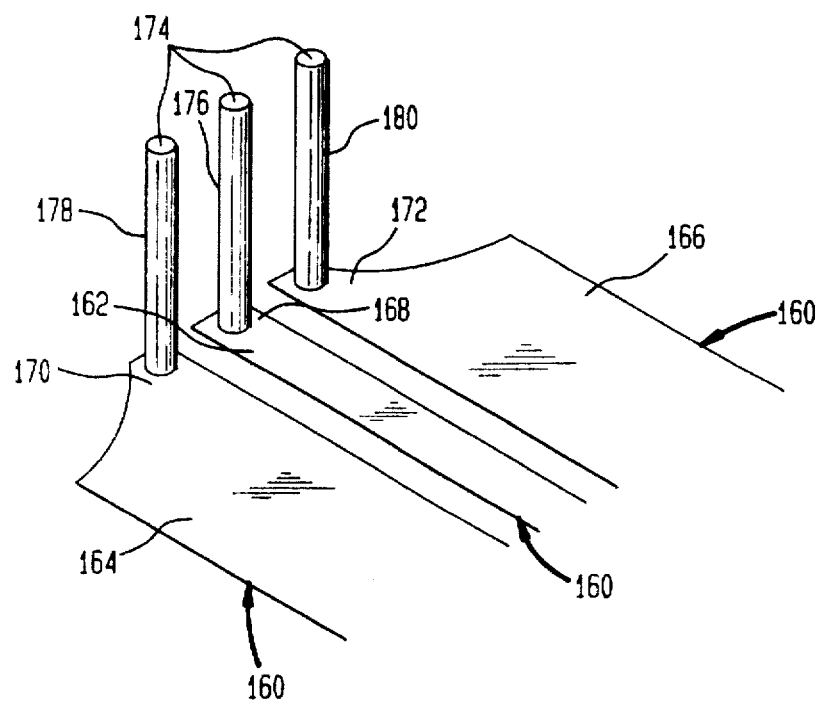
FIG. 20 is a perspective view illustrating a transition from a three-wire via transmission line to a tapered coplanar line according to the present invention.

In a similar manner, a coplanar line can be tapered to provide wide band transmission. Referring to FIG. 20, transition from a coplanar line 160 to a three-wire via transmission line 174 is shown. Again, assuming that the diameters of the wires 176, 178, 180 forming the via transmission line 174 are equal, wide band transition can be obtained by tapering the two ground planes 164, 166 and the signal line 162 of the coplanar line 160 into three strips 168, 170, 172 having equal widths and equal impedances, while maintaining the same overall impedance in the line.

Figure 21:
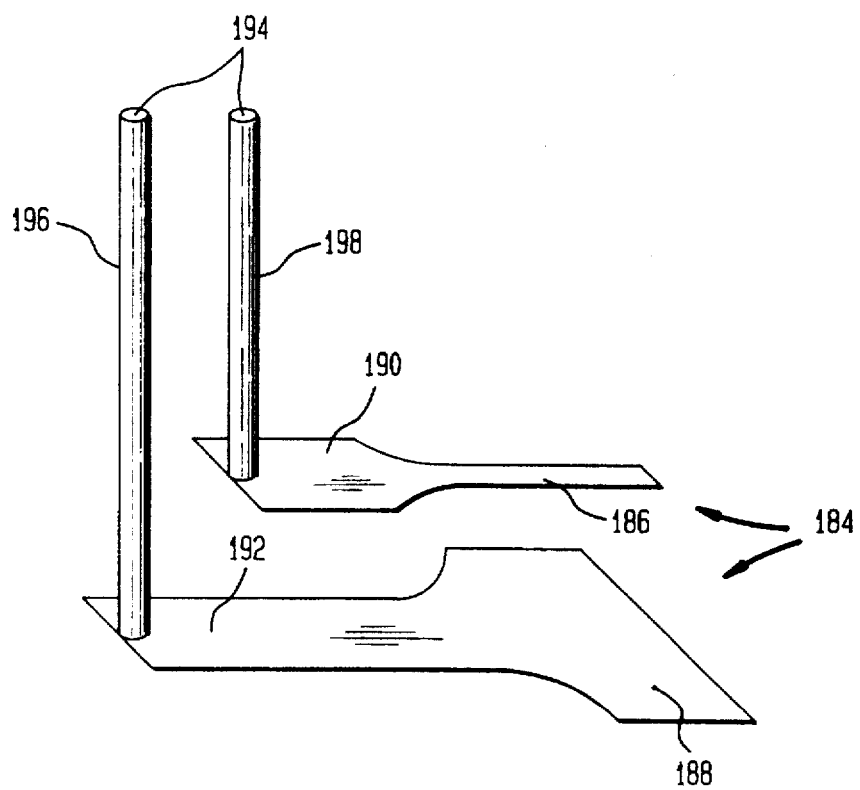
FIG. 21 is a perspective view illustrating a transition from a two-wire via transmission line to a tapered microstrip line according to the present invention.

In addition to stripline and coplanar line, a microstrip line can be tapered to provide wide band transmission. Referring to FIG. 21, transition from a microstrip line 184 to a via-hole transmission line 194 having two-wires 196, 198 of equal diameter is shown. By tapering the ground plane 188 and the signal line 186 of the microstrip line 184 into two strips 190, 192 having equal widths and equal impedances, while maintaining the same overall impedance in the line, wide band transition can be obtained.

Method to Improve the Impedance Match for Ninety Degree Via to Planar RF Transmission Line Transitions Using Chamfered Vertical Via Transmission Lines In still another exemplary embodiment of the present invention, wide frequency band transition is obtained by improving the match for the ninety-degree transition from a planar transmission line to a vertical transmission line. Specifically, the match is improved by chamfering for increasing the radius of the bent portion of a via transmission line (the portion of the via transmission line that is coupled to the planar transmission line) as shown in FIG. 22.

Figure 22:
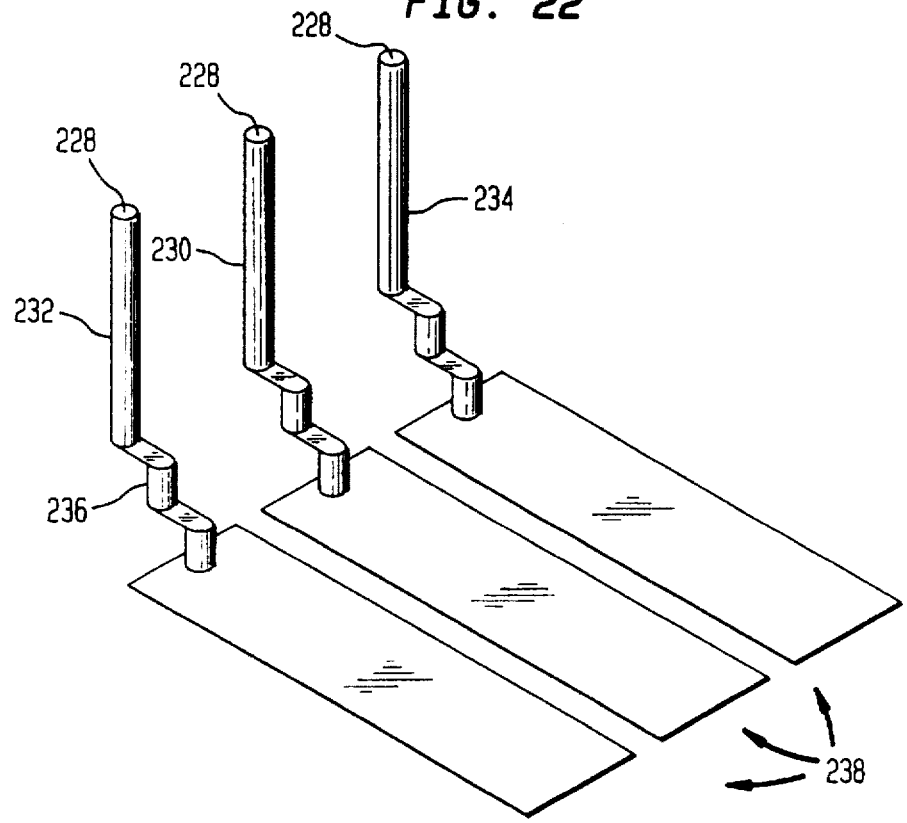
FIG. 22 is a perspective view illustrating an improved matching of right angle transitions from a three-strip coplanar line to a via transmission line according to the present invention.

Referring to FIG. 22, a via transmission line 228 having three wires 230, 232, 234 and a chamfered or large radius bend 236 in each wire is shown being coupled to a three-strip stripline coplanar line 238. It should be understood, however, that the large radius bend 236 shown in FIG. 19 is not limited as described, bearing in mind that matching between via transmission lines and planar transmission lines improves in proportion to the size of the bend. Again, chamfer in vertical lines using staggering of vias is difficult to accomplish with conventional technology, but can be readily accomplished with LTCC technology.

Figure 23:
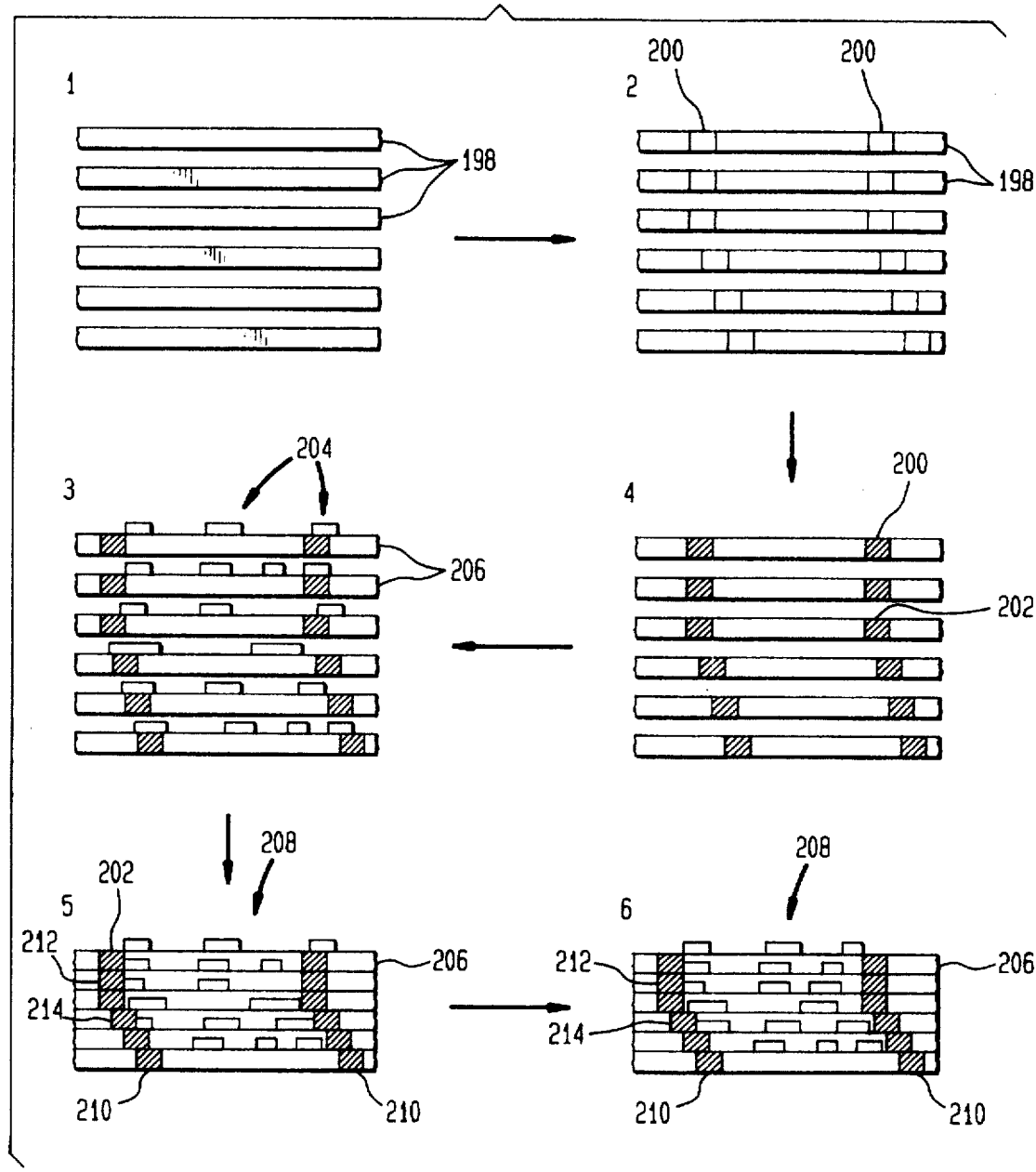
FIG. 23 is a schematic view of a technique for producing a multilayer circuit structure according to the present invention.

Referring to FIG. 23, the various processing stages for producing a multilayer circuit structure according to the present invention is shown. In the first stage in FIG. 23, several thin dielectric substrate layers 198 having a predetermined size and shape are provided. Preferably, the dielectric substrate layers 198 are fabricated from Low Temperature Co-fired Ceramic (LTCC) tape. The LTCC tape comprises a relatively thin tape (approximately five mils) of alumina-filled glass and crystallizable ceramic, which lowers the firing temperature of the tape to below 900° C., and thus, enables the substrate and the screen printed circuits to be co-fired. In the green or unfired state, the tape is flexible. Thus, the via-holes can be readily punched out, thereby enabling the via RF transmission lines to be fabricated.

Alternatively, Low Temperature Transfer Tape (LTTT), which is a flexible cast film of inorganic dielectric powder dispersed in an organic matrix, can also be utilized. It should be understood, however, that the present invention is not limited to LTCC or LTTT tape.

The second stage in FIG. 23 depicts the formation of the via 200 within each substrate layer 198. The via 200 are punched into the substrate layers 198 in a predetermined configuration. Since the substrate layers 198 are unfired or in the green state, the via 200 can be readily punched out.

In the third stage in FIG. 23, the via 200 are filled with a suitable conductive material to form transmission line segments 202. Such conductive materials are well known in the art.

In the fourth stage in FIG. 23, a plurality of predetermined conductive and resistive patterns 204 are screen printed onto the substrate layers 198 via conventional techniques to form processed substrate layers 206. The conductive and resistive patterns 204 include various configurations of stripline transmission lines as previously described.

The fifth stage in FIG. 23 depicts the processed substrate layers 206 being vertically stacked to form a multilayer configuration 208. In this configuration, the transmission line segments 202 form columns 210 of via, whereby each column 210 comprises and upper portion 212 and a large radius bend or chamfered lower portion 214 are located below the upper portion 212. The segments comprising the upper portion 212 of each column 210 are arranged in a relatively straight, vertical line. The segments comprising the large radius bend 214 of each column 210 are offset slightly from layer to layer. It should be understood that the large radius bend 214 of each column 210 can be formed either by staggering the processed layers 206 of the multilayer configuration or by staggering the placement of the via-holes 200 within the substrate layers 198.

During the sixth and final stage of FIG. 23, the stacked processed layers 206 are fired in a furnace to form a sintered and densified, hermetically sealed multilayer circuit configuration 208. As a result, each column 210 of vias forms a bona fide via RF transmission line having an upper vertical portion 212 and a large radius bend 214.

Figure 24:
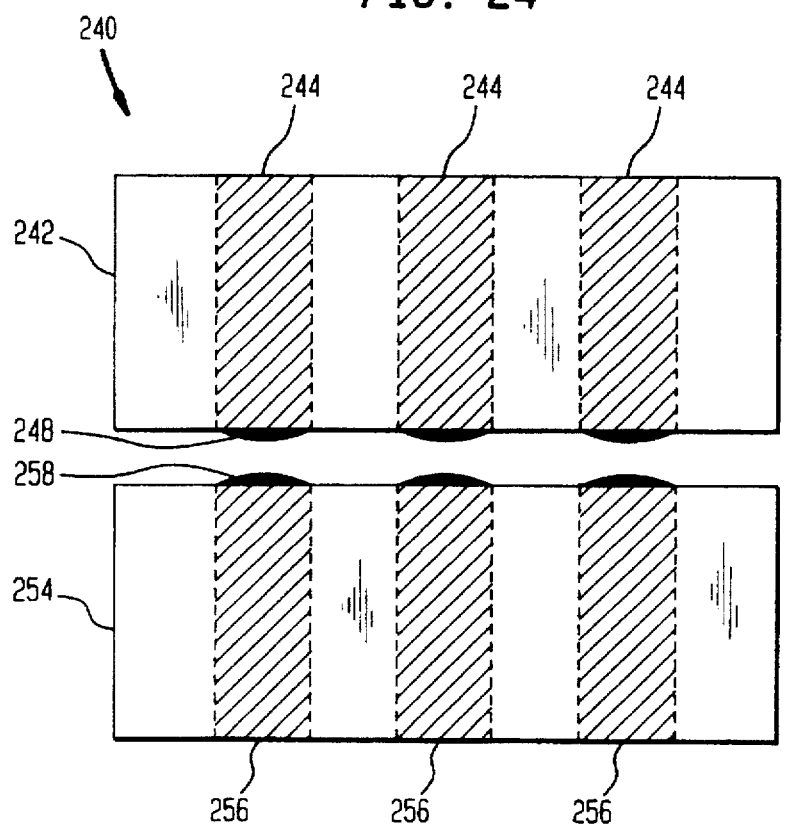
FIG. 24 is schematic view of interconnecting via RF transmission lines between two multilayer circuit assemblies according to the present invention.

Method to Interconnect Multi-Wire Via RF Transmission Lines Between Two or More Multi-Layer Circuit Assemblies Referring to FIG. 24, a method to interconnect via 3-wire RF transmission lines between two or more multilayer circuit assemblies according to the present invention is shown. The assembly 240 includes a first multilayer circuit structure 242 and a second multilayer circuit structure 254, which are represented by sectional views of these structures. Both circuit structures preferably have the same basic structure as described in the process disclosed in FIG. 23, which includes RF via transmission lines extending through a plurality of ceramic substrate layers.

Still referring to FIG. 24, the first circuit structure 242 has solder bumps 248 vertically disposed over each of the imbedded RF via transmission lines 244, while the second circuit structure 254 also has solder bumps 248 vertically disposed over each of the imbedded RF via-hole transmission lines 256.

In order to make an RF connection, the two circuit structures 242, 254 are aligned and brought into contact so that the solder bumps on 248, 258 are aligned. The diameter and height of the solder bumps 248, 258 are sized to provide maximum contact area on imbedded RF via transmission lines 244, 256 and minimum squeeze out beyond the imbedded RF via transmission lines 244, 256 after solder reflow. A permanent electrical connection is made between both sets of via transmission lines 244, 256 by either mechanical pressure contact or eutectic solder reflow. Since the optimal diameter of the reflowed solder bumps 248, 258 are the same as the diameter of the via transmission lines 244, 256, the RF mismatch is minimized.

Figure 25:
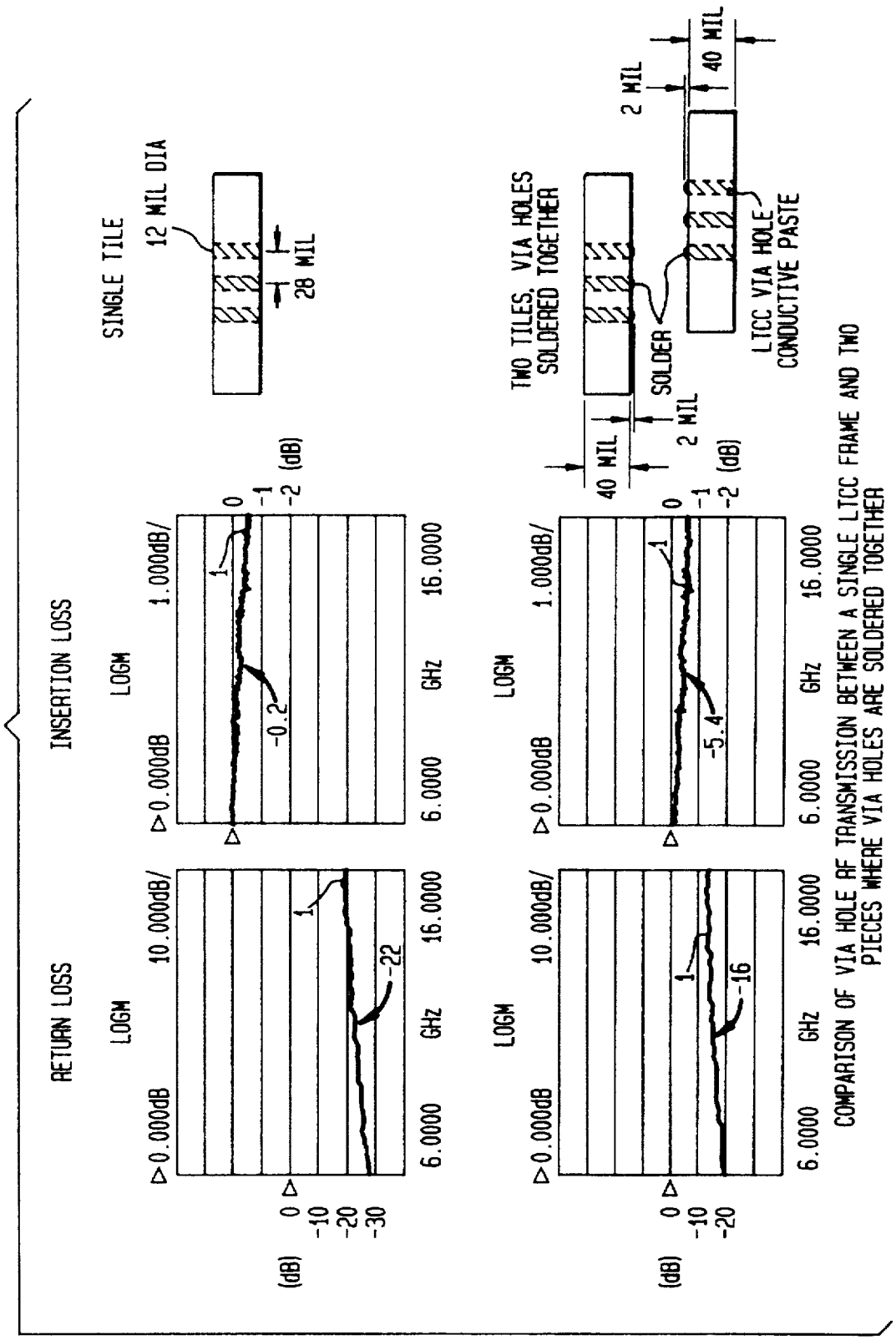
FIG. 25 is comparison between return loss and insertion loss of three-wire via transmission line in a single LTCC multilayer assembly and that in two LTCC multilayer assemblies with vias soldered together with solder bumps.

FIG. 25 shows comparison between the return loss and insertion loss of a via 3-wire RF transmission line in a single piece of LTCC substrate and that in two pieces of LTCC substrate with the vias joined together using the solder bump method discussed above.

FIG. 26 shows comparison between the return loss and insertion loss of a via 3-wire RF transmission line in a single piece of LTCC substrate and that in three pieces of LTCC substrate with the vias joined together using the solder bump method discussed above.

From FIGS. 25 and 26, it is seen that the junction of the vias has negligible effect on the RF transmission of the via transmission line.

A variation of the above method to interconnect via multi-wire RF transmission lines between two or more multilayer circuit assemblies according to the present invention is shown in FIG. 27, in which the first circuit structure has recess 268 vertically disposed over each of the embedded RF via transmission lines 266, while the second circuit structure 276 also has recesses 280 vertically disposed over each of the embedded RF via transmission lines 278. Each of the recesses 268 contain a solder ball 270, which is preferably secured within the recesses 268 by an electrical conductive epoxy 272. A permanent electrical connection is made between both sets of via transmission lines 266, 278 by either an electrical conductive epoxy or eutectic solder reflow.

While the above example involves a via 3-wire transmission line, the process can be readily extended to other via multi-wire transmission lines.

While preferred forms and arrangements have been shown in illustrating the invention, it is to be understood that various changes may be made without departing from the spirit and scope of this disclosure.

What is claimed is:

1. A multi-layer circuit structure comprising:

a plurality of substrate layers;

at least one RF transmission line disposed on said plurality of substrate layers and including a signal strip and at least one ground strip;

a via transmission line connected to each of said at least one RF transmission line and extending through said plurality of substrate layers and including a via signal wire and at least one via-ground wire; and said via transmission lines having the same topology as said at least one RF transmission line for providing wide frequency band transition there between wherein said signal strip and said at least one ground strip each include a tapered portion for further improving wider frequency band transition, said tapered portion of both said signal strip and said at least one ground strip located adjacent to where said via transmission lines are connected to said at least one RF transmission line.

2. The structure of claim 1, wherein said plurality of substrate layers are fabricated from a ceramic material.

3. The structure of claim 1, wherein said plurality of substrate layers are bonded together to form an integrated unit.

4. The structure of claim 1, wherein said signal strip and said at least one ground strip are both disposed on a single substrate layer of said plurality of substrate layers.

5. The structure of claim 1, wherein said at least one RF transmission line ground is two stripline ground strips.

6. The structure of claim 5, wherein said at least one via-ground wire is a plurality of via wires.

7. A multi-layer circuit structure comprising:

a plurality of substrate layers;

at least one RF transmission line disposed on said plurality of substrate layers and including a signal strip and a plurality of ground strips;

a via transmission line connected to each of said at least one RF transmission line and extending through said plurality of substrate layers and including a via signal wire and a plurality of via-ground wires; and said via transmission lines having the same topology as said at least one RF transmission line for providing wide frequency band transition there between, wherein said signal strip and said plurality of ground strips are disposed on a single substrate layer of said plurality of substrate layers, and wherein said via signal wire and said plurality of via-ground wires each include a bent lower portion for improving the matching of the transition between said via transmission lines and said at least one RF transmission line.

8. The structure of claim 7, wherein said bent lower portions are chamfered to increase the radius of said bent lower portion.

* * * * *